United States Patent [19]

Doan et al.

[11] Patent Number: 5,346,585
[45] Date of Patent: Sep. 13, 1994

[54] USE OF A FACETED ETCH PROCESS TO ELIMINATE STRINGERS

[75] Inventors: Trung T. Doan; Guy T. Blalock, both of Boise, Id.

[73] Assignee: Micron Semiconductor, Inc., Boise, Id.

[21] Appl. No.: 49,274

[22] Filed: Apr. 20, 1993

[51] Int. Cl.⁵ .......................................... H01L 21/00
[52] U.S. Cl. ........................... 156/643; 156/646; 156/656; 156/657; 437/228
[58] Field of Search ............... 156/656, 657, 643, 646; 437/228, 195, 238, 241, 235

[56] References Cited

U.S. PATENT DOCUMENTS 5,203,957  4/1993  Yoo et al. ................. 156/657 X

FOREIGN PATENT DOCUMENTS 256727  11/1986  Japan ......................... 437/195

*Primary Examiner*—Thi Dang
*Attorney, Agent, or Firm*—Lia M. Pappas

[57] ABSTRACT

A process to create a faceted (prograde) profile for an integrated circuit, in which the top corners of a layer disposed over a feature are preferentially etched, thereby creating slopes. The profile which results from the deposit of subsequent layers is more easily etched as a result of the contour imparted by the faceted edges. Since the subsequent layers are placed in the "line of sight" of the etch plasma, there are significantly fewer "stringers."

17 Claims, 3 Drawing Sheets

USE OF A FACETED ETCH PROCESS TO ELIMINATE STRINGERS

RELATED CASES

This application discloses subject matter also disclosed in copending application Ser. No. 08/049,044, filed Apr. 16, 1993 and also assigned to Micron Semiconductor, Inc.

FIELD OF THE INVENTION

This invention relates to semiconductor manufacturing, and more particularly to the use of facet etching to eliminate "stringers."

BACKGROUND OF THE INVENTION

In the manufacture of integrated circuits, deposition of films or materials with non-conformal properties over retrograde topography often yields subsequent structures which also have retrograde or re-entrant profiles. Subsequent depositions of non-conformal and other films over re-entrant profiles frequently results in structures having an "overhang" which obscures the underlying topography.

Retrograde profiles may result from the deposition of: non-conformal films over ideally vertical profiles, and conformal films over profiles which are already retrograde.

Some manufacturing applications involve depositing a material over features which may have retrograde or re-entrant profiles, and then patterning and etching the material. Anisotropic etches (i.e., etches exhibiting no significant undercut) are used to prevent significant critical dimension loss. "Critical dimension" referring to the distance between features.

Anisotropic etches remove material in a direction perpendicular to the plane defined by the substrate. The material which is etched, must therefore be in the "line of sight" of the plasma, as viewed from a point directly "above" the feature. Consequently, any overhanging topography will shelter the material to be anisotropically etched. If conductive materials, such as polysilicon form the layers, conductive shorts may result between adjacent features as a consequence of the residual sheltered material. The residual material is referred to as a "stringer," as seen in FIG. 1.

"Stringers" can be defined as residual material resulting from an etch process. The "stringers" are a problem when they are comprised of a conductive material which causes short circuiting between adjacent structures.

Ion sputter etching has been found to have a characteristic etch pattern. This etch pattern makes reactive ion sputter etching a useful tool in forming faceted edges. The graph in FIG. 2 illustrates the Etch Angle versus Yield of the etch. Note that the Yield is highest at an angle of approximately 45°. FIG. 3 illustrates the facet which results at the edges of a feature during the etch process. The facet angle is also approximately 45°.

In sputter etch, ions which impinge on horizontal surfaces have a minimal effect on etch rate and profile. However, the sputter yield of the etch at the corners is approximately four times that of the etch rate of a horizontal surface, thereby creating an extreme etch profile. The effect is the wearing away of the corners of a feature at approximately 45° angles. The material removed by the sputter etch is redeposited along the sides of the feature and along the surface of the substrate. The amount of material redeposited is also effected by the actual shape of the feature being etched. Additionally, the redeposited material acts to fill cavities present in retrograde structures.

Current stacked capacitor dynamic random access memories (DRAMS) often comprise components which have high, vertical (retrograde) topologies. Such topologies are susceptible to "stringers" following etch steps. Since DRAMs are comprised of polysilicon, which is a conductive material, any "stringers" may result in non-functional parts and consequent yield loss.

SUMMARY OF THE INVENTION

A process to perform a facet etch in order to create a prograde profile over which to deposit further layers. Then subsequently performing a substantially anisotropic etch on the layered feature, such that essentially all of the material in the "line of site" of the etch is substantially removed, and the existence of any significant amount of residual material is substantially eliminated.

One advantage of the process of the present invention is the substantial elimination of "stringers," thereby resulting in production yield enhancement.

Another advantage is that much more robust and selective processes can be used to effect the anisotropic etch when retrograde profiles are not a concern. Further, there is a significant reduction in the amount of time used for the overetch process step.

A further advantage of the process of the present invention is the increased control over the amount of substrate material which is lost during the etch process. The use of a facet etch permits accentuation of the etched features without significant removal of the underlying substrate material. The maintenance of the substrate is an important manufacturing concern. Thus, the process of the present invention affords a significant manufacturing advantage.

BRIEF DESCRIPTION OF THE DRAWINGS

The present invention will be better understood from reading the following description of non-limitative embodiments, with reference to the attached drawings, wherein below.

DETAILED DESCRIPTION OF THE INVENTION

For purposes of this application, "feature" refers to any geometric structure disposed on a semiconductor wafer. "Feature" includes, but is not limited to metal lines, interconnects, capacitors, gates, nodes, etc.

Figure 1:
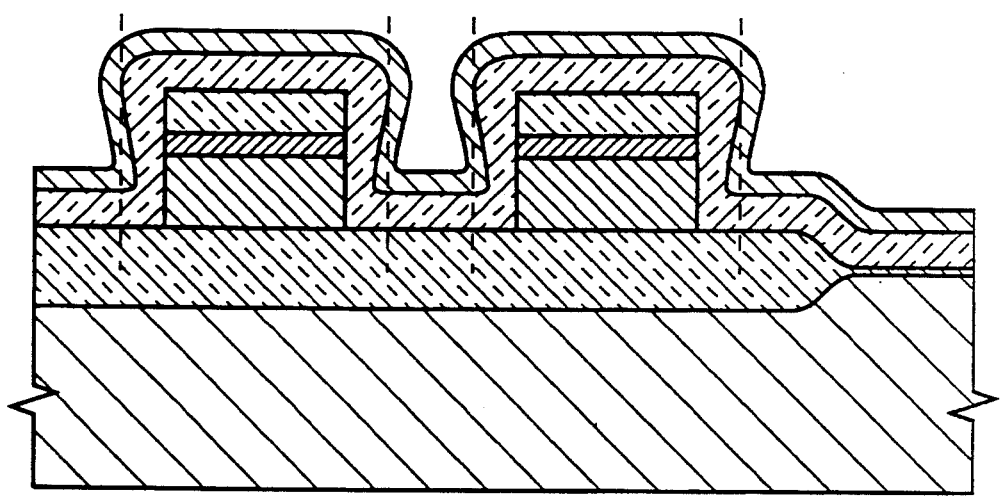
FIG. 1 is a schematic cross-section of the problem of conductive "stringers" in the prior art method.
Figure 2:
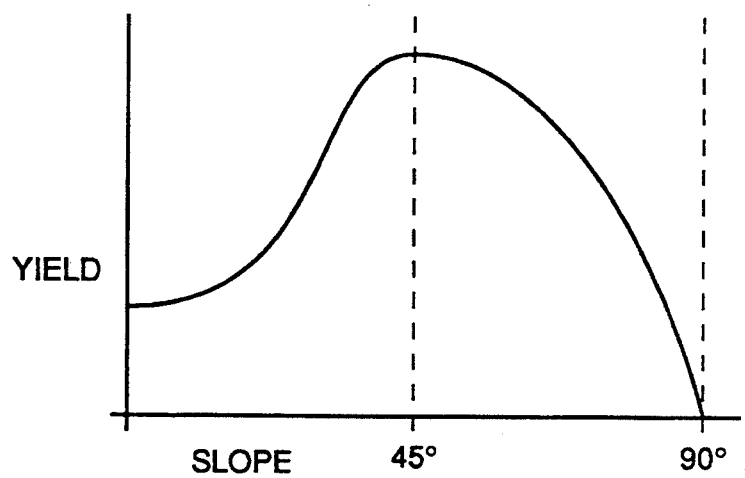
FIG. 2 is a graph of Yield versus Etch Angle for a reactive ion sputter etch.
Figure 3:
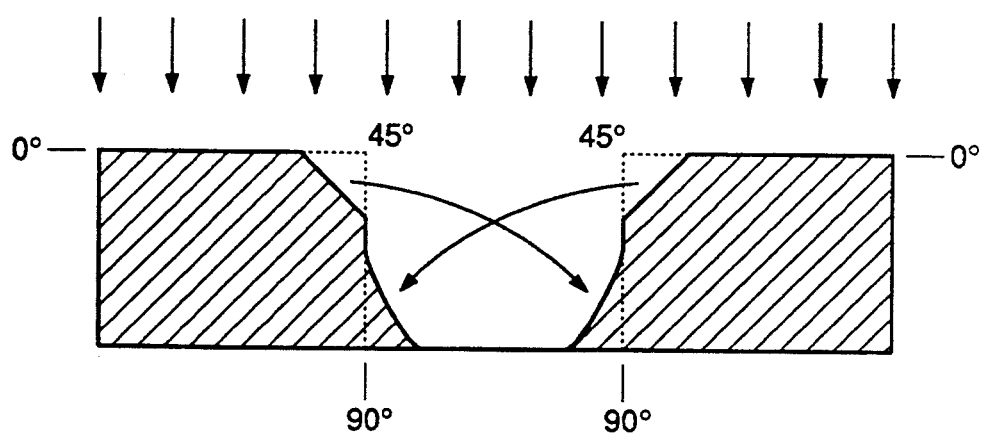
FIG. 3 is a schematic diagram of the angle of ion impingement on a material used in the manufacture of an integrated circuit, and the consequent shape of the structures upon removal of material.
Figure 4:
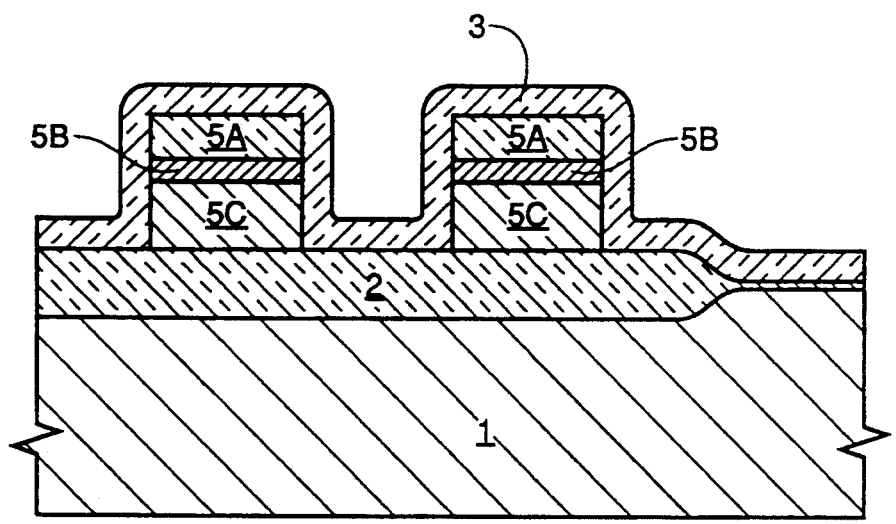
FIG. 4 is a schematic cross-section of a semiconductor substrate having an insulating layer disposed on a feature, prior to being etched according to the process of the present invention.

The preferred embodiment of the process is shown in FIG. 4, which depicts an integrated circuit feature 5, disposed on a layer of field oxide 2 which is disposed on a substrate 1. The substrate 1 can be a wafer comprised of silicon or other semiconductor material. The oxide layer 2 can also comprise a different material layer disposed on a semiconductor wafer, which layer is used in the manufacture of integrated circuits, depending on the stage of production at which the process of the present invention is employed.

The preferred embodiment describes the process of the present invention in terms of a stacked capacitor. However, the preferred embodiment is simply illustrative; the process of the present invention being useful in other circumstances in which non-conformal or other layers are deposited, and subsequently anisotropically etched. The process of the present invention being especially useful in etch processes in which it is important to maintain critical dimension size.

The integrated circuit features 5 of the preferred embodiment, are comprised of a conductive layer 5c, such as polysilicon; on which is disposed another conductive layer 5b, such as tungsten silicide ($WSi_x$); on which is disposed an insulating layer 5a, such as an oxide.

A layer 3 is disposed, preferably by deposition, superjacent the features 5 by any suitable method known in the art. Layer 3 is preferably an insulator, such as for example TEOS, an oxide, a nitride, polyimide, or other suitable dielectric. A TEOS layer 3 is preferred because TEOS displays relatively good conformal characteristics. The process of the present invention employs a facet etch process to smooth the topology of the insulator layer 3, prior to the deposition and patterning of a subsequent conductive layer 6.

Figure 5:
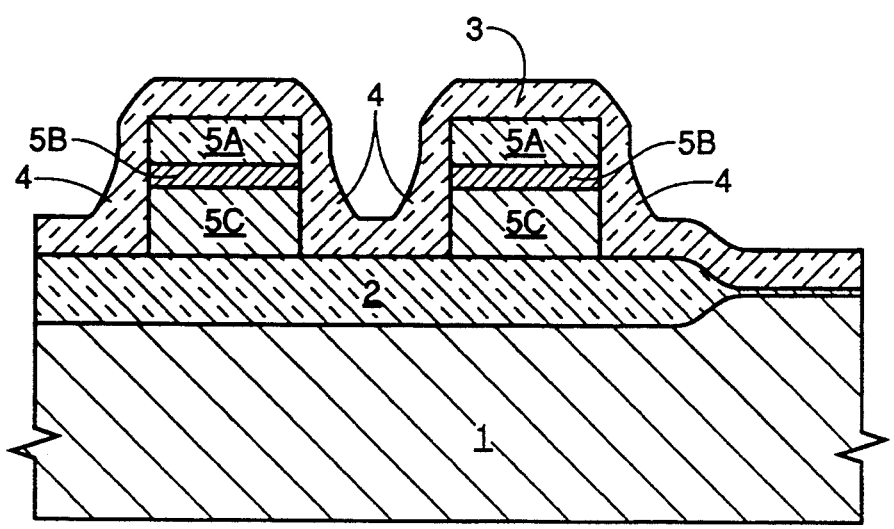
FIG. 5 is a schematic cross-section of the semiconductor substrate of FIG. 4, after a facet etch has been performed according to the process of the present invention.

Referring to FIG. 5, the prograde profile created in layer 3 is illustrated. In the preferred embodiment of the present invention, the top corners of the insulating layer 3 are preferentially etched compared to the etch rate of the vertical and horizontal surfaces, thereby creating slopes, i.e., facets. The material removed from the corners of layer 3, redeposits at the base of the features 4, thereby further sloping the profile. The profile which results when layer 6 is subsequently deposited is more easily etched as a result of the faceted edges. Hence, there will be significantly fewer "stringers" after the process of the present invention has been undertaken.

In the preferred embodiment, the preferred species to create a facet is argon (Ar). The facet is created using an argon plasma at a low pressure. The workpiece is placed on the cathode (i.e. the powered electrode) in a reactive ion etcher, a plasma etcher, or other suitable apparatus that is capable of accelerating ions toward a substrate with high energy.

It is well-known in the art that surfaces at disposed at a 45° angle to the oncoming ions, are etched at a greatly enhanced rate. An angled surface can be sputter etched at an accelerated rate four to five times the rate of a horizontal surface. The accelerated etch rate tends to create a characteristic faceted profile of which the 45° angles are further accented. In addition, the redeposited sputter material acts to further increase the slope profile.

The etch of the present invention has a basis in the physical nature of the reaction, more specifically in ion bombardment. Hence, the process of the present invention is most effective when performed in a chamber in which ions can be accelerated. Such chambers are known in the art, and include, but are not limited to, Reactive Ion Etchers (R.I.E.), preferably magnetically enhanced reactive ion etchers, and high density source etchers.

The facet etch is preferably performed by placing the desired substrate 1 in a high vacuum reactor on a cathode for which a power source creates a radio frequency (RF) of 13.56 Mhz, while controlling the introduction of the etchant gases.

The walls of the reactor are grounded to allow for a return RF path. This chamber configuration is generally referred to as a Reactive Ion Etcher (R.I.E.). The RF power source acts to create a plasma condition within the chamber, thereby allowing for the creation of charged particles or ions.

Due to the physics of the RF powered electrode, a direct current self-bias voltage condition is created at the substrate 1 location. This self-bias condition acts to direct the charged particles or ions toward the wafer 1 in a direction perpendicular to the wafer surface 1.

If the pressure is in a range being slightly less than 30 mtorr, the mean free path of the charged particles or ions will be great enough to allow for physical sputtering of substrate material 1 when the ions impinge on the surface of the substrate 1. It is important to note that a wide variety of systems and parameters can be used to effect a facet etch, as long as the pressure limit is not violated. As the pressure nears and exceeds 30 mtorr, the results of the process are effected.

Typical parameters for facet etching using an Applied Materials 5000 Series equipment are as follows:
RF power: 300–700 watts
pressure: 10–30 mtorr
etchant : 30–70 sccm.

Inert gases, including but not limited to argon (Ar), helium (He), and xenon (Xe) are effective etchant gases for performing the facet etch. The inert gas tends to further enhance the uniformity of the etch process. Argon is preferred because of its weight and commercial availability, but the other inert gases can also be used.

The facet etch can also be performed with any other suitable gas which is inert with respect to the semiconductor substrate.

Figure 6:
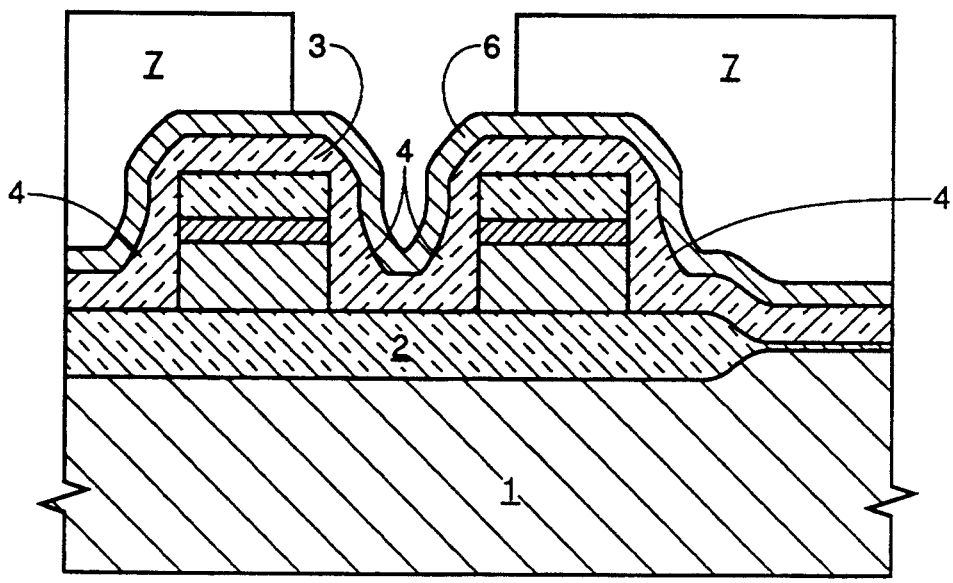
FIG. 6 is a schematic cross-section of the semiconductor substrate of FIG. 5, after a conductive layer and a photoresist pattern have been deposited, according to the process of the present invention.

FIG. 6 illustrates the degree of step-coverage possible with the subsequent deposition of a layer 6 when employing the process of the present invention. The redeposited material 4 in the corners of the features 5 enables a more uniform blanketing of the superjacent layer 6. The layer 6 is deposited by any suitable method known in the art, such as sputtering or chemical vapor deposition (CVD).

Materials used for layer 6 are preferably conductive, and include, but are not limited to metals and polysilicon. The preferred embodiment employs polysilicon, as polysilicon displays good conformal qualities. However, non-conformal and other suitable materials can also be used to form layer 6.

A layer of photoresist 7 is patterned superjacent layer 6. Looking at the area delineated by layer 7, it is apparent that essentially no portion of layer 6 is overshadowed by layer 3, not even in the corners. Hence, a substantially anisotropic etch removes essentially all of the unmasked portion of layer 6, i.e., the portion in the "line of sight."

Any suitable etch chemistry known in the art that will effect a substantially anisotropic etch of layer 6 can be used. In the preferred embodiment, the etch of a polysilicon layer 6 selective to an oxide insulating layer 3 is performed in a R.I.E. with chlorine (Cl), fluorine (F), or bromine (Br) based etchant chemistries using substantially the same parameters as those described above.

Figure 7:
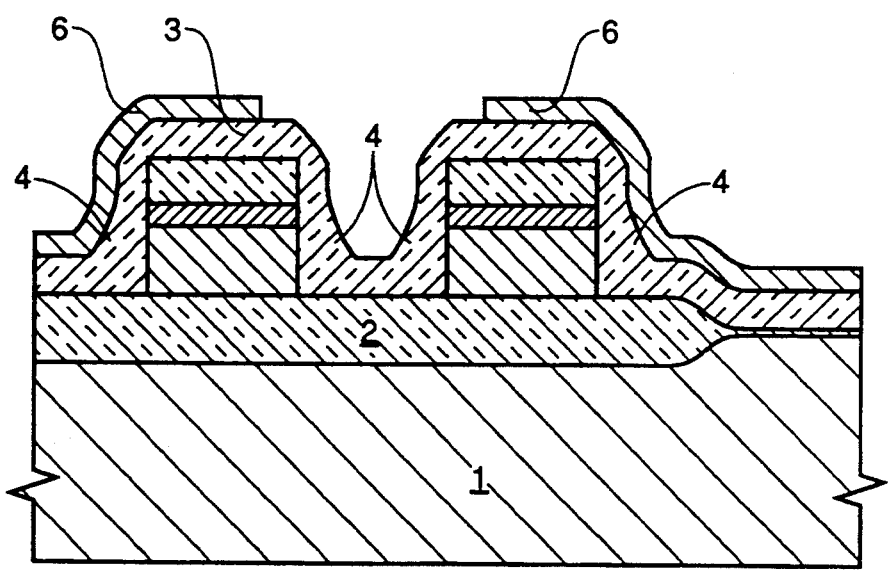
FIG. 7 is a schematic cross-section of the semiconductor substrate of FIG. 6, after the conductive layer has been etched and the photoresist pattern has been removed, according to the process of the present invention.

FIG. 7 illustrates the structure which results after layer 6 has been etched according to the process of the present invention. The photoresist layer 7 has also been removed. Since essentially all of the unmasked portion of the layer 6 was removed, there is no significant amount of residue, i.e., "stringers."

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that the facets can be created on a variety of geometric configurations whose height to width aspect ratios may be quite varied, thereby placing underlying layers in the "line of sight" of a plasma, in order to effect a substantially anisotropic etch.

What is claimed is:

1. A method to minimize residual deposits during etch, said method comprising the following steps of:
   creating a first layer having a prograde profile, said prograde profile of said first layer being formed by removing a portion of said first layer and depositing said portion at another site on said first layer;
   disposing another layer superjacent said first layer; and
   patterning and selectively removing said another layer, whereby said removal of said another layer is unobstructed by said profile of said first layer.

2. The method according to claim 1, wherein said portion of said first layer is removed by ion bombardment.

3. The method according to claim 2, wherein said ions comprise at least one of argon, xenon, and helium.

4. The method according to claim 3, wherein said first layer is an insulator, said insulator being conformal.

5. The method according to claim 4, wherein said another layer is conductive, said another layer being at least one of a metal or polysilicon, said another layer being conformal.

6. A process for minimizing residue when etching layers, said process comprising the following steps of:
   disposing a first layer over at least one feature, said feature having sidewalls, said first layer having a profile;
   altering said profile of said first layer, wherein said profile of said first layered is altered by removing a portion of said first layer and redepositing said portion at another site on said first layer, said altered profile being prograde;
   disposing a second layer superjacent said first layer;
   removing a section of said second layer at least along one of side sidewalls.

7. The process according to claim 6, wherein said second layer is conformal, said second layer conforming to said profile of said first layer, said section of said second layer being substantially unobstructed by said profile.

8. The process according to claim 7, wherein said section is removed by a substantially anisotropic etch.

9. The process according to claim 6, wherein said profile is altered by ion bombardment, said ion bombardment creating facets in said first layer.

10. The process according to claim 9, wherein said ions create a plasma, said ions comprise at least one of argon, xenon, and helium.

11. The process according to claim 10, wherein said plasma is generated in a reactive ion etcher.

12. A method for etching relatively closely spaced features, said method comprising the following steps of:
   disposing a substrate in a reactor, said substrate having closely spaced features disposed thereon, said features being covered by a first material; and
   creating an atmosphere in said reactor, said atmosphere comprising ions, said ions preferentially removing said first material, thereby creating facets in said first material;
   disposing a second material superjacent said first material; and
   substantially removing a portion of said second material located between said features.

13. The method according to claim 12, wherein said ions comprise at least one of argon, xenon, and helium.

14. The method according to claim 13, wherein said portion is removed by a substantially anisotropic etch.

15. The method according to claim 14, wherein said anisotropic etch is performed in a reactive ion etcher using at least one of chlorine (Cl), fluorine (F), and bromine (Br).

16. The method according to claim 15, wherein said first material is an insulator.

17. The method according to claim 16, wherein said second material is conductive.

* * * * *